United States Patent
Hennig

(10) Patent No.: US 6,456,071 B1
(45) Date of Patent: Sep. 24, 2002

(54) METHOD OF MEASURING THE MAGNETIC RESONANCE (=NMR) BY MEANS OF SPIN ECHOS

(75) Inventor: Jürgen Hennig, Freiburg (DE)

(73) Assignee: Universitatsklinikum Freiburg (DE)

( * ) Notice: Subject to any disclaimer, the term of this patent is extended or adjusted under 35 U.S.C. 154(b) by 0 days.

(21) Appl. No.: 09/906,310

(22) Filed: Jul. 16, 2001

(30) Foreign Application Priority Data

Jul. 18, 2000 (DE) .......................................... 100 35 319

(51) Int. Cl.[7] ................................................ G01V 3/00
(52) U.S. Cl. ........................ 324/307; 324/309; 324/311
(58) Field of Search ................................ 324/307, 309, 324/311, 312, 314, 300

(56) References Cited

U.S. PATENT DOCUMENTS

| | | | |
|---|---|---|---|
| 5,475,308 A | * 12/1995 | Piatto et al. | 324/307 |
| 5,677,628 A | 10/1997 | Watanabe et al. | |
| 5,894,221 A | * 4/1999 | Watanabe et al. | 324/307 |
| 5,955,883 A | 9/1999 | Hennig | |
| 6,005,390 A | 12/1999 | Watanabe et al. | |

FOREIGN PATENT DOCUMENTS

| | | |
|---|---|---|
| DE | 196 10 278 A1 | 9/1996 |
| DE | 196 26 255 A1 | 1/1998 |
| JP | 08252230 A | 10/1996 |

OTHER PUBLICATIONS

Hahn E L, Spin Echoes, Phys.Rev. 80:580–594 (1950).
Meiboom S, Gill D, Modified Spin–Echo Method for Measuring Nuclear Relaxation Times, Review of Scientific Instruments, 29:688–691 (1958).
Hennig J. Multiecho Imaging Sequences with Low Refocusing Flip Angles, J.Magn.Reson., 78:397–407 (1988).

(List continued on next page.)

Primary Examiner—Edward Lefkowitz
Assistant Examiner—Brij B Shrivastav
(74) Attorney, Agent, or Firm—Walter A. Hackler

(57) ABSTRACT

A method of NMR spectroscopy or tomography, wherein a sequence of temporarily offset radio frequency pulses is applied onto a spin ensemble, is characterized in that after a sequence of pulses with flip angles $\alpha_1 \ldots \alpha_n$ (with $\alpha_1 \ldots \alpha_n \geq 0°$) and phases $\phi_1 \ldots \phi_n$ between which spins are dephased by $\phi_1 \ldots \phi_n$, a central refocusing pulse is applied as (n+1)th pulse, followed by a pulse sequence which is mirror-symmetrical to the central refocusing pulse, wherein the flip angles $\alpha_{n+2} \ldots \alpha_{2n+1}$ and phases $\phi_{n+2} \ldots \phi_{2n+1}$ of the pulses have, in comparison with the mirror-symmetrical pulses with $\alpha_n \ldots \alpha_1$ and $\phi_n \ldots \phi_1$, negative sign with respect to amplitude and phase and the dephasings $\phi_{n+2} \ldots \phi_{2n+1}$ which are also mirror-symmetrical to the central refocusing pulse in the sequence are equal to the respective mirror-symmetrical dephasings $\phi_n \ldots \phi_1$ such that at the end of the pulse sequence, an output magnetization $M_A(Mx,My,Mz)$ of the spin ensemble is refocused with respect to the central refocusing pulse through application of rotation corresponding to the symmetrical relation $$M_R(-Mx,My,-Mz)=Rot_y(180°)*M_A(Mx,My,Mz)$$

into a final magnetization $M_R=(-Mx,My,-Mz)$ (=hyperecho formation). In this fashion, even after application of refocusing pulses of any flip angles, the occurring signal losses can be cancelled and the complete signal amplitude can be regained with respect to dephasing through chemical shift, susceptibility and field inhomogeneity.

15 Claims, 12 Drawing Sheets

OTHER PUBLICATIONS

Le Roux P. Hinks RS, Stabilization of echo amplitudes in FSE sequences, Magn Reson Med. 30:183–90 (1993).

Alsop DC, The sensitivity of low flip angle RARE imaging, Magn Reson Med. 37:176–84 (1997).

Gullion T, Baker DE, Conradi MS., J.Magn.Reson. 89, 479 (1990).

van Uijen CM, den Boef JH, Driven–equillibriun radiofrequency pulses in NMR imaging, Magn Reson Med. 1984 Dec;1(4):502–7.

Hennig J, Thiel T, Speck O, Improved Sensitivity to Overlapping Multiplet Signals in in vivo Proton Spectroscopy Using a Multiecho Volume Selective (CPRESS–) Experiment, Magn Reson Med. 37: 816–20 (1997).

Haase A, Snapshot FLASH MRI. Applications to T1, T2, and chemical–shift imaging, Magn Reson Med. 13:77–89 (1990).

Norris D G, Ultrafast low–angle RARE: U–FLARE, Magn Reson Med. 17: 539–542 (1991).

* cited by examiner

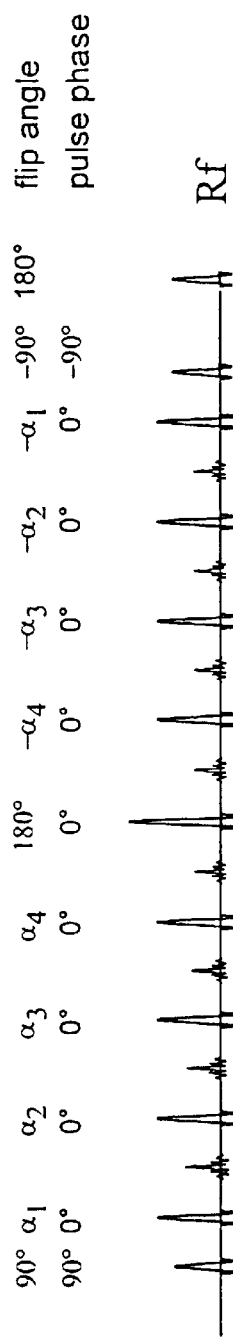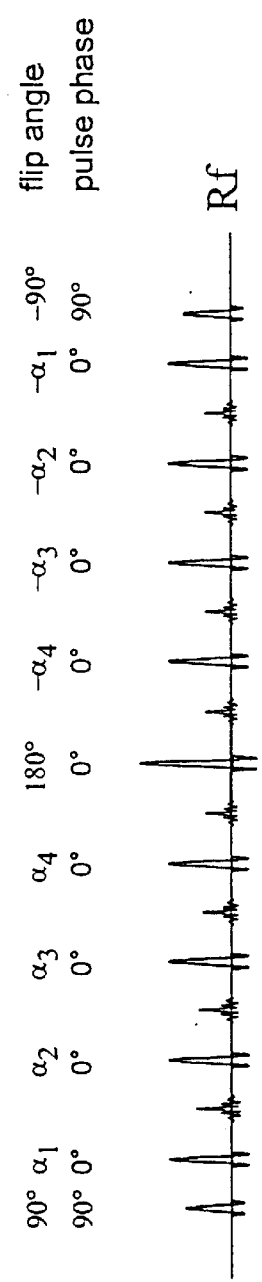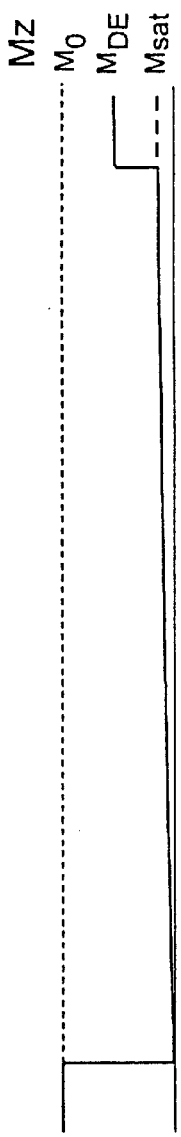
FIG. 4A.  FIG. 4B.

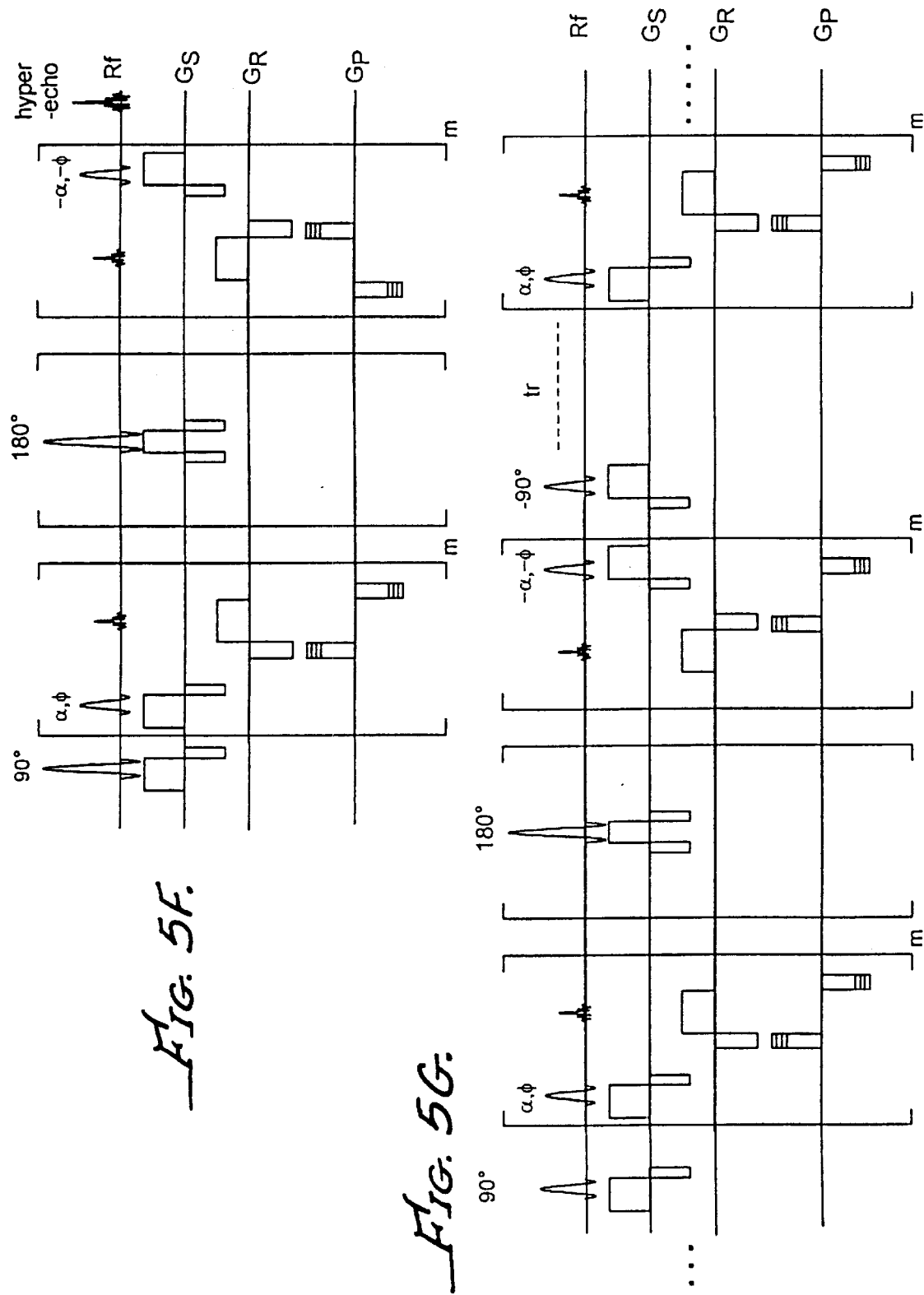

METHOD OF MEASURING THE MAGNETIC RESONANCE (=NMR) BY MEANS OF SPIN ECHOS

This application claims Paris Convention priority of German patent application number 100 35 319.3 filed on Jul. 18, 2000, the complete disclosure of which is hereby incorporated by reference.

BACKGROUND OF THE INVENTION

The invention concerns a method of NMR spectroscopy or nuclear magnetic resonance tomography, wherein a sequence of temporally offset radio frequency pulses is applied onto a spin ensemble, at least one of which is designed as refocusing pulse.

In the following, reference is made to the accompanying literature list ("D" and corresponding numbers in round brackets).

A nuclear magnetic resonance signal is frequently measured by means of the spin echo method known from (D1). The excited magnetization is thereby after a period te/2 submitted to a refocusing pulse and a spin echo is formed after a further time period te/2. At the time of the spin echo, effects acting on the spins, such as chemical shift, susceptibility, field inhomogeneity, are refocused such that all spins have a coherent signal phase with respect to these effects. The signal maximum is achieved if the flip angle of the refocusing pulse is exactly 180°. In practice, such an ideal flip angle can only approximately be realized such that, in particular with methods based on formation of many spin echos, one obtains signal losses due to deviation of the flip angle of the refocusing pulses by 180°.

Such a deviation can occur either through technical facts or be artificially produced, e.g. in applications on human beings for keeping the values of the radiated radio frequency energy within tolerable limits (SAR=specific absorption rate). Literature proposed a series of measures for limiting the corresponding signal losses. This includes on the one hand the so-called Carr-Purrcell-Meiboom-Gill method (D2) wherein by an appropriate displacement of the pulse phase between excitation and refocusing pulses, partial automatic compensation of the refocusing pulses is effected.

It could be shown that with such a sequence with long echo trains, high echo amplitudes could be achieved (D3) even with small refocusing flip angles.

When using different flip angles across the first refocusing periods of the multi-echo train, the echo amplitude can be further increased (D4)(D5).

In applications of analytical NMR spectroscopy, improvements through different phase cycles such as MLEV16 or XY16 are used (D6). These serve mainly for compensating residual small errors in refocusing pulses with a flip angle of approximately 180°.

All methods known from literature include that in case of deviation of the flip angle of only one single refocusing pulse by 180°, signal loss occurs which can, at best, be reduced through corresponding design of the subsequent refocusing pulses.

In contrast thereto, it is the object of the present invention to present a method for reversing the occurred signal losses even after application of refocusing pulses of any flip angle, and reproduce the complete signal amplitude with respect to dephasing through chemical shift, susceptibility and field inhomogeneity.

SUMMARY OF THE INVENTION

In accordance with the invention, this object is achieved in a effective manner in that after a sequence of pulses with flip angles $\alpha_1 \ldots \alpha_n$ (with $\alpha_1 \ldots \alpha_n \geq 0°$) and phases $\phi_1 \ldots \phi_n$ between which spins are dephased by $\phi_1 \ldots \phi_n$, a central refocusing pulse is applied as (n+1)th pulse, followed by a pulse sequence which is mirror-symmetrical to the central refocusing pulse, wherein the flip angles $\alpha_{n+2} \ldots \alpha_{2n+1}$ and phases $\phi_{n+2} \ldots \phi_{2n+1}$ of the pulses have, in comparison with the corresponding pulses with $\alpha_n \ldots \alpha_1$ and $\phi_n \ldots \phi_1$, a negative sign with respect to amplitude and phase and the dephasings $\phi_{n+2} \ldots \phi_{2n+1}$ which are also mirror-symmetrical to the central refocusing pulse in the sequence are equal to the mirror-symmetrical dephasings $\phi_n \ldots \phi_1$ such that at the end of the pulse sequence, an output magnetization $M_A(Mx, My, Mz)$ of the spin ensemble is transferred with respect to the central refocusing pulse through application of rotation corresponding to the symmetrical relation $$M_R(-Mx, My, -Mz) = Rot_y(180°) * M_A(Mx, My, Mz)$$

into a final magnetization $M_R = (-Mx, My, -Mz)$ and thereby refocused neglecting relaxation effects.

Refocusing, effected by the inventive pulse sequence, of the initial magnetization $M_A$ is characterized as hyper echo formation.

Method

The main idea is based on the observations of symmetry relations with respect to vector rotation: We observe rotations of vectors which hold:

Rotation about the z axis by an angle $\phi$:

$$Rot_z(\varphi_n) = \begin{vmatrix} \cos(\varphi_n) & \sin(\varphi_n) & 0 \\ -\sin(\varphi_n) & \cos(\varphi_n) & 0 \\ 0 & 0 & 1 \end{vmatrix} \quad [1]$$

Rotation about the y axis by an angle $\alpha$:

$$Rot_y(\alpha_n) = \begin{vmatrix} \cos(\alpha_n) & 0 & -\sin(\alpha_n) \\ 0 & 1 & 0 \\ \sin(\alpha_n) & 0 & \cos(\alpha_n) \end{vmatrix} \quad [2]$$

Rotation $Rot_\phi(\alpha)$ about a rotary axis which is tilted in the x-y plane about an angle $\phi$ with respect to the y axis can be described as:

$$Rot_\phi(\alpha) = Rot_z(\phi_n) Rot_y(\alpha_n) Rot_z(-\phi_n) \quad [3]$$

Corresponding to the conventions of the matrix multiplication, calculation is effected from the right to the left.

Observation of two vectors $V(x,y,z)$ and $V^*(-x,y,-v)$ which are disposed symmetrically with respect to rotation about 180° about the y axis, facilitates representation (FIGS. 1A–1c):

L1: Rotation $Rot_z(\phi)$ of a vector $V(x,y,z)$ about the z axis at an angle $\phi$ produces the resulting vector $V'(x',y',z)$. For a vector $V^*(-x,y,-z)$ rotated with respect to V about the y axis by 180°, the point $V^{*'}(-x',y',-z)$ corresponding to $V'$ results from $V^*$ through rotation. by $-\phi$ (FIG. 1A).

Accordingly V can be transferred by rotation about z with a turning angle of $\phi$, subsequent rotation about y with a turning angle of 180° and subsequent rotation about z with $\phi$ in $V^*$:

$$V^*(-x, y, -z) = Rot_z(\phi) * Rot_y(180°) * Rot_z(\phi) * V(x, y, z) = Rot_y(180°) V(x, y, z). \quad [4]$$

L2: Rotation $Rot_y(\alpha)$ of V about the y axis by an angle $\alpha$ generates the resulting vector $V'(x',y,z')$. The corresponding symmetrical point V*'(-x',y',-z) also results from V* through rotation by α.

A trivial addition of the turning angle (FIG. 1B) thus obtains:

$$V^*(-x, y, -z) = Rot_y(\alpha)^* Rot_y(180°)^* Rot_y(-\alpha)^* V(x, y, z) = Rot_y(180°) V(x, y, z). \quad [5]$$

From L1 and L2 together with equation [3] one obtains:

L3: Rotation $Rot_\phi(\alpha)$ by an angle α, of V about an axis, tilted with respect to the y axis by φ produces the resulting vector V'(x',y,z'). The corresponding symmetrical point V*' (-x',y',-z) results from V* through rotation $Rot_\phi(\alpha)$ about a rotational axis tilted with respect to the y axis by -φ. Therefore (FIG. 1C):

$$V^*(-x, y, -z) = Rot_\phi(-\alpha)^* Rot_y(180°)^* Rot_\phi(\alpha)^* V(x, y, z)$$

And with equations [3]–[5]:

$$V^*(-x, y, -z) = Rot_z(\phi_n)^* Rot_y(-\alpha_n)^* Rot_z(-\phi_n)^* Rot_y(180°)^* Rot_z(-\phi_n)^* Rot_y(\alpha_n)^* Rot_z(\phi_n)^* V(x, y, vz) = Rot_y(180°) V(x, y, z). \quad [6]$$

Rotation with −α about an axis −φ corresponds to rotation with α about 180°−φ:

$$Rot_\phi(-\alpha) = Rot_{180°-\phi}(\alpha) \quad [7]$$

Both nomenclatures are equivalent and are used in the following depending on their practicability.

These initially purely mathematical symmetrical relations can be converted into pulse sequences of NMR spectroscopy or MR tomography. Equation [4] is the basis of the spin echo experiment by Hahn, which says:

Dephasing $Rot_z(\phi)$, applied to magnetization $M_A(-Mx, My, -Mz)$, defined as $$M_A(Mx, My, Mz) = \begin{vmatrix} Mx \\ My \\ Mz \end{vmatrix}$$

and subsequent refocusing by a 180° pulse $Rot_y(180°)$ and further phase development corresponding to $Rot_z(\phi)$ produces magnetization $M_R(-Mx,My,-Mz)$ which is rotationally symmetrical with respect to $M_A$.

Corresponding to equation [4] thus results:

$$M_R(-Mx, MY, -Mz) = Rot_z(\phi)^* Rot_y(180°)^* Rot_z(\phi)^* M_A(-Mx, My, -Mz) = Rot_y(180°)^* M_A(Mx, My, Mz) \quad [8]$$

which means that spins are refocused by a 180° pulse independent of their phase development φ.

The phase development about φ can thereby be effected either through temporally constant mechanisms such as chemical shift, inhomogeneities etc., wherein dephasing is then characterized by an off resonance frequency ω and φ becomes proportional to the respective time intervals corresponding to φ=ω. φ may also be determined through variables such as magnetic field gradients or movement in inhomogeneous fields. In terms of NMR, the rotation about a rotational axis in the x-y plane described in equations [5]–[7] corresponds to application of a radio frequency pulse with flip angle α.

Starting from the spin echo sequence corresponding to [8] same can be symmetrically extended according to L1–L3, equations [4]–[7] thereby maintaining the rotational symmetry, wherein the sequence in both cases is extended either by one dephasing interval corresponding to equation [4] or a pulse corresponding to equations [5]–[7].

Usually pulse sequences in MR are represented as alternating sequence of pulses and subsequent time intervals which is also the convention followed in the following examples of implementation. All statements are, of course, also true for sequences, wherein several radio frequency pulses directly follow one another or contain several dephasing steps between 2 radio frequency pulses.

The temporal development between two pulses may be arbitrary. Decisive is merely the total dephasing between subsequent pulses. Therefore, the inventive method can be formulated as follows:

Multiple pulse sequence in NMR spectroscopy or MR tomography, wherein a sequence of 2n+1 radio frequency pulses is applied to a spin system with magnetization $M_A(Mx,My,Mz)$ is characterized in that at first n radio frequency pulses $R(\alpha_n, \phi_n)$ are applied with respective temporal separation tn which effect rotation $Rot_{\phi n}(\alpha_n)$ of the spins, wherein the spins experience, in the time intervals $I_n$ between the pulses, a phase development about $\phi_n$ corresponding to a rotation $Rot_z(\phi_n)$ about z, and subsequently a refocusing pulse $R(\alpha_{n+1}, \phi_{n+1}) = R(180°, 0°)$ followed by n radio frequency pulses $R(\alpha_{n+2}, \phi_{n+2}) \ldots R(\alpha_{2n+1}, \phi_{2n+1})$ in a temporally reversed order and corresponding to the relation given in equations [5]–[7]

$$R(\alpha_{n+2}, \phi_{n+2}) \ldots R(\alpha_{2n+1}, \phi_{2n+1}) = R(-\alpha_n, -\phi_n) \ldots R(-\alpha_1, -\phi_1) = R(\alpha_n, 180°-\phi_n) \ldots R(\alpha_1, 180°-\phi_1) \quad [9]$$

and $$\phi_{n+1} \ldots \phi_{2n} = \phi_n \ldots \phi_1 \quad [10]$$

thereby obtaining magnetization $M_R$ which holds:

$$M_R(-Mx, My, -Mz) = Rot_y(180°)^* M_A(Mx, My, Mz), \quad [11]$$

which means that the initial magnetization $M_A$ is refocused independently of $\alpha_n$, $\phi_n$ and $\phi_n$.

This sequence is illustrated in FIG. 2.

According to the basic principle, that radio frequency pulses having a complicated amplitude and phase profile (as used e.g. for slice selection in NMR tomography) can be represented as a sequence of short pulses with discrete flip angle, equations [9]–[11] are valid analogously also for pulse sequences with amplitude and/or phase-modulated pulses. Additionally, it should be noted that the phase of the central refocusing pulse was defined to be 0° and does not necessarily need to correspond to the reference phase of magnetization. Coordination transformation of equations [9]–[11] corresponding to equation [3] makes the refocusing relation of equation [11] also valid for any phases of the central pulse if corresponding transformation is carried out also for the other pulses.

For a central pulse having a phase C which effects rotation corresponding to (180°,ζ) equation [9] results in:

$$R(\alpha_{n+2}, \phi_{n+2}) \ldots R(\alpha_{2n+1}, \phi_{2n+1}) = R(-\alpha_n, -\phi_n + 2\zeta) \ldots R(-\alpha_1, -\phi_1 + 2\zeta) = R(\alpha_n, 180°-\phi_n + 2\zeta) \ldots R(\alpha_1, 180°-\phi_1 + 2\zeta) \quad [12]$$

For completion it should be noted that the central refocusing pulse may also have a flip angle of <180°. The amplitude of the formed refocused magnetization is then correspondingly weakened.

Such a pulse sequence refocuses all spins independent of their respective and optionally different phase development and form a coherent spin echo. This refocusing process through a pulse sequence is called below hyper-echo formation.

Relaxation proceedings were not taken into consideration in this derivation which lead to relaxation-based signal attenuation.

It is possible to derive a series of realizations on the basis of known pulse sequences from the basic sequence shown in FIG. 2A. Introduction of a hyper-echo formation into an existing sequence can thereby be effected in different ways:

As shown in FIG. 2B, an existing sequence (in the present case a simple spin echo sequence having a 90° excitation pulse and a 180° refocusing pulse) can be modified through introduction of further pulses corresponding to equations [9]–[11] into a hyper-echo sequence. Sequences where the temporal sequence of pulses already meets the dephasing conditions for hyper-echo formation thereby require optionally only modification of the flip angle and pulse phases (see below).

FIG. 2C shows the principle of integration of the hyper-echo formation through supplementation: Any pulse sequence (in this case consisting of an excitation pulse with subsequent n radio frequency pulses) is converted to a hyperecho sequence by adding a refocusing pulse and subsequent pulses according to equations [9]–[11] to form a hyper-echo.

Finally, FIG. 2D shows application of a hyper-echo for preparing magnetization as hyper-echo which is subsequently read with any pulse sequence (in the present case a simple spin echo).

Of course, these different types of introduction of a hyper-echo can be arbitrarily combined. Formation of several hyper-echos within one sequence can also be advantageous.

Some examples of application are shown below. It must be stated that the NMR literature describes an extremely large number of different multiple pulse sequences which can only be exemplarily described below. The expert can easily apply the method of symmetrization described in equations [9]–[11] for forming a completely refocused spin echo such that the following examples do not represent a limitation but merely show the general application possibilities of the basic principle.

The following application classes seem to be advantageous:

1. Multi-echo Sequences

Application of the principle described in equation [11] to transverse magnetization recovers complete magnetization—when relaxation effects are neglected—(corresponding to the continuous use of refocusing pulses having a flip angle of 180°) for any values of $\alpha_1 \ldots \alpha_n$. While the amplitude is <<1 after each echo produced by $\alpha_n$, the complete amplitude is recovered after the inventive sequence.

A special case of equations [9]–[11] is given when the magnetization vector $M_A$ is oriented parallel to the central refocusing pulse $R(180°)$. In this case $M_R=M_A$, i.e. magnetization is converted into itself (except for relaxation effects during the sequence). This is the case e.g. in the CPMG multi echo methods (D2) wherein magnetization is generated by a 90° pulse. In the subsequent multiple refocusing, 180° pulses are applied with a phase which is perpendicular to the excitation pulse and thus parallel to the excited magnetization.

Clinical application of such sequences often requires selection of the flip angle of the refocusing pulse <180° to limit the radio frequency output (D3). Modification of a CPMG method according to the inventive method can be realized as below:

If $M_A$ is magnetization directly after excitation and possible phase effects during the excitation pulse are neglected, the condition $M_A$ parallel to $R(180°,0)$ is met for all subsequent refocusing pulses. For all $\phi_n$ thus holds:

$$\phi_n=\phi_0=0.$$

Due to the equidistant refocusing pulses in CPMG sequences (and when using symmetrical conditions corresponding to magnetic field gradients for dephasing caused thereby) it is furthermore true for all $\phi_n$:

$$\phi_n=\phi_1$$

The symmetry of the inventive sequence is achieved in this case through inversion of the respectively applied flip angles. The phases always remain zero (FIG. 3):

$$R(\alpha_{n+2},0) \ldots R(\alpha_{2n+1},0)=R(-\alpha_1,0) \quad [13]$$

With this modification, the amplitude of the (2n+1)th echo can be reproduced to the completely refocused value (=1) for any $\alpha_1 \ldots \alpha_n$. When using such a sequence in MR tomography corresponding to the RARE method, the contrast of the image is essentially given by the intensity of the echo which represents the center of the k space in the phase encoding direction.

In a preferred implementation of the inventive method, it is therefore reasonable to recover complete refocusing for exactly this echo. Towards this end, in a first approximation, the signal intensity of the image becomes independent of $\alpha_1 \ldots \alpha_n$. Selection of $\alpha_1 \ldots \alpha_n<180°$ only slightly changes the sharpness of the image. It is advisable thereby to chose values for $\alpha_1 \ldots \alpha_n$ which generate a possibly high and homogeneous echo amplitude as described e.g. in (D4) and (D5).

In particular, for so-called multi-contrast methods wherein phase encoding is carried out such that at least the center of the k space is read several times and at different echo times, the principle according to equation [12] can be repeated several times even during an echo train such that several hyper-echos can be formed in one echo train.

The chosen example of application to a RARE sequence merely has illustrative character. Hyper-echos can be integrated also in other imaging sequences such as GRASE, BURST etc. to improve the signal behavior through refocusing of magnetization.

2. Driven Equilibrium Sequences

A further particularly preferred application of the inventive method deals with recovery of z magnetization in so-called driven equilibrium (DEFT) sequences. Application of DEFT to spin echo sequences for MR imaging was described already in 1984 (D7). It is based on the application of a so-called flip back pulse at the time of echo formation, i.e. when all transverse magnetization is refocused. This flip back pulse converts the remaining transverse magnetization into z magnetization. Same is thus closer to the thermal equilibrium which achieves higher signal intensity with identical recovering time.

In a hyper-echo sequence, such conversion of the spin system in the direction of balanced magnetization can be realized in two ways: If the entire sequence is designed according to the principles of hyper-echo formation and applied to z magnetization, magnetization at the time of hyper-echo formation according to [11] will be z magnetization. Same can be converted into z magnetization through a directly following 180° pulse (FIG. 4A). The same effect can be achieved if the 90° pulse is phase-inverted at the end of the hyper-echo sequence thereby acting as a flip back pulse which converts magnetization directly into +z magnetization (FIG. 4B).

RARE (TSE . . . ) sequences having small refocusing flip angles (see above) permit rotation back to the z axis only of part of the magnetization by means of a flip back pulse due to incomplete refocusing. Application of the inventive method, however, allows regaining of the entire transverse magnetization through formation of a hyper-echo for the time of the flip back pulse and conversion into z magnetization through flip back.

This application is mainly (but not exclusively) useful for application in high field systems wherein on the one hand, often small refocusing flip angles are used due to the increased radio frequency absorption, and furthermore long repeating times are required due to the generally longer T1 relaxation times with increasing field strength without flip back to balance out magnetization as well as possible before the next excitation.

The method is thereby particularly preferred for applications which offer an inherently short repeating time, such as e.g. recordings with three-dimensional local encoding or rapidly repeated recordings for observing temporally changing processes.

It is also possible to refocus gradient echo sequences through hyper-echo formation by introducing a 180° pulse into the sequence after reading out m excitation intervals, in which one gradient echo is generated in each case, followed by further m excitation intervals with pulses corresponding to equation [11]. FIG. 5A shows a hyper-echo sequence based on a gradient echo sequence. Therein, the temporal succession of the entire sequence was converted after the 180° pulse and the pulses were changed corresponding to [9]–[11]. To simplify matters, FIG. 5A shows a sequence with constant flip angle $\alpha$. Taking into consideration equations [9]–[11] hyper-echo formation is effected also for sequences with variable ox.

As shown, the signals recorded in the second half of the sequence correspond to the signal parts refocused by the 180° pulse. Since the symmetry condition for the hyper-echo formation holds true merely for the entire spin dephasing between two subsequent radio frequency pulses in each case, the sequence shown in FIG. 5B also leads to hyper-echo formation. In contrast to FIG. 5A, in this case, merely the read gradient GR was temporally inverted (and the slice selection gradient GS was made symmetrical) such that now, the gradient echos directly generated by the respectively preceding radio frequency pulse, were formed also in the second half of the sequence. Considering [9]–[11] with respect to total dephasing between the pulses, a hyper-echo is also formed in this case.

Suitable selection of the gradients allows reading out of both possible signal groups (FIG. 5C). Same may either be generated and read separately. When the reading gradient GR is designed such that the entire surface below GR between 2 refocusing pulses becomes zero, these signals overlap to form one single signal corresponding to the principle of the FISP sequence.

The measuring methods shown in FIGS. 5A–C can be carried out either such that the signals used for imaging are recorded in one single hyper-echo train. This can be carried out also such that a data set required for image construction is achieved only after multiple repetition of the corresponding sequences. In particularly preferred implementations, inversion of the initial z magnetization caused by hyper-echo formation—as already shown in the multi-echo method in FIG. 4—is inverted before the recovering time through a 180° pulse and thus brought closer to an equilibrium (FIG. 5D).

It should finally be noted that formation of several hyper-echos is possible also for gradient echo sequences (FIG. 5E).

When the excitation pulse is started with a flip angle of generally, but not necessarily 90°, the hyper-echo can also be formed as signal with transverse magnetization (FIG. 5F) which can again be converted into z magnetization corresponding to the description for multi-echo sequences through a flip back pulse (FIG. 5G) before the recovering time tr. In the variants shown in FIGS. 5D–G, the generic sequence (FIG. 5A) was taken as a basis but also the variants corresponding to FIG. 5B,C (inclusive FISP) can be used.

To optimize steady-state magnetization in continuous methods such as FIG. 5E, it may also be useful to realize the initial excitation pulse and the refocusing pulse used for hyper-echo formation not as pulses having a flip angle of 90° and 180° but as pulses with correspondingly smaller flip angles $\beta$ (excitation) or $2\beta$ (refocusing), wherein the phase of the refocusing pulses alternates with repeated application according to the principle of a true FISP sequence.

Hyper-echos can be integrated also in other imaging sequences, such as echo planar imaging, spiral imaging etc. to modify the contrast behavior e.g. corresponding to the formation of the driven equilibrium.

The application, as described, onto measuring methods in MR imaging are merely illustrative. A large number of measuring sequences in analytical NMR—mainly multiple-dimensional Fourier spectroscopy—such as COSY, NOESY, INEPT, INADEQUATE etc.—to name only some of the current sequences, is based on a plurality of repetitions of multi-pulse sequences. With all these sequences, balanced magnetization can be achieved more rapidly through formation of a hyper-echo with subsequent flip back pulse and thus reduction of the measuring time and/or increase of the signal-to-noise ratio. If in such sequences, pulses are applied to different nuclei, formation of hyper-echos onto all nuclei concerned is advantageous.

The use of hyper-echos in driven equilibrium sequences is particularly advantageous mainly for observing nuclei with long T1 since in this case, magnetization with a suitable sequence (e.g. imaging) can be read and subsequently re-stored as z magnetization to be read out again at a later time.

A preferred application in this case is the measurement using hyper-polarized magnetization (e.g. through corresponding preparation of hyper-polarized inert gases). Therein, the longitudinal magnetization is prepared in a state far beyond from the thermal equilibrium. The prepared spin system thus produces a signal intensity which is in factors of several thousand above that of the balanced magnetization. Such hyper-polarized substances are applied e.g. in MR tomography using hyper-polarized helium for illustrating the lung. A problem produced in this connection is that magnetization, once it has been excited, relaxes into the balanced state and thus loses polarization. The use of flip back sequences allows regaining of the polarized magnetization without the relaxation losses caused by T2 and can thus be re-used several times.

3. Spin Selection

Hyper-echo sequences may be used for selecting a sub-amount of the originally excited spins if modification is carried out such that the symmetrical condition of equation [11] leading to hyper-echo formation is fulfilled only for part of the spin. A large number of such applications can be derived from the plurality of sequences known in NMR literature which can be described only illustratively and not completely below.

3.1. Spin Selection Through Variation of Symmetrical Conditions for Hyper-echo Formation Spin selection in a hyper-echo experiment can be realized by selecting the pulse sequence such that the symmetrical conditions of equation [11] are met only for part of the initially excited spins. This can be achieved e.g. with application of slice-selective pulses in that the individual pulses act in each case only onto spins within a certain frequency range through selection of corresponding pulse profiles. With corresponding selection of the respective frequency ranges, it is possible to filter out signals from a partial range of the excitation profile of each pulse. With simultaneous application of magnetic field gradients during the pulses, one can observe spins from corresponding spatial volumes.

FIG. 6 shows in this connection a simple example of application, wherein the profiles of the corresponding pulses which are symmetrical with respect to the central 180° pulse are displaced with respect to one another such that hyper-echo formation is effected only in the overlapping central spectral range (grey) whereas the signals of the outer regions appear to be dephased depending on phase and flip angle of the pulses.

A particularly effective type of this hyper-echo formation results when the phase of the pulses 1 ... n is continuously alternated since spins in the outer regions are submitted only to the pulses with the identical phase used in a Carr-Purrcel sequence which is known to produce a rapid signal loss and thus signal suppression for $\alpha < 180°$.

Other implementations are also possible which have the common feature that the condition for hyper-echo formation is fulfilled only in the region of the desired excitation window. A particularly simple implementation can be achieved also in that merely the central refocusing pulse has a different selectivity (e.g. chemical shift selectivity) with respect to the other pulses of the hyper-echo sequence.

A generalization of this principle is schematically shown in FIG. 7, which shows that a complex excitation window can be obtained through application of a pulse sequence with simple excitation profiles.

Spin selection is also possible through modification of the temporal order of the pulse sequence before and/or after the central 180° pulse through an additional modulation step $E(\phi_E)$. In case of introduction before the central 180° pulse, the effect of the pulse sequence is then according to equations [9]–[11] described as $$M_R(Mx,My,Mz)=R(\alpha_1,180°-\phi_1,\phi_1) \ldots *R(\alpha_{n-1},$$
$$180°-\phi_{n-1}, \phi_{n-1})*R(\alpha_n, 180°-\phi_n,\phi_n)*R($$
$$180°,0,0)*$$
$$E(\phi_E)*R(\alpha_n,\phi_n,\phi_n) \ldots *R(\alpha_2,\phi_2,\phi_2)*R$$
$$(\alpha_1,\phi_1, \phi_1) \, M_A(Mx,My,Mz) \qquad [14].$$

Hyper-echo formation occurs only for that part of the spins for which magnetization remains unchanged, corresponding to the vectorial disintegration, this is $M_R{}^{cos}(\phi_E)$. The corresponding orthogonal component $M'_R$ "sees" pulses which are phase-shifted by 90° after the interval $E(\phi_E)$ and therefore develops:

$$M'_R(Mx,My,Mz)=R(\alpha_1,90°-\phi_1,\phi_1)*R(\alpha_{n-1},90$$
$$°-\phi_{n-1}, \phi_{n-1})*R(\alpha_n,90°-\phi_n,\phi_n)*R(180°,90°$$
$$,0)*$$
$$E(\phi_E)*R(\alpha_n,\phi_n,\phi_n) \ldots *R(\alpha_2,\phi_2, \phi_2)*R$$
$$(\alpha_1,\phi_1, \phi_1) \, M_A(Mx,My,Mz) \qquad [15].$$

With corresponding selection of $\phi_1 \ldots \phi_n$, this signal portion is suppressed. In the most simple case, this can be achieved for $\phi_1 \ldots \phi_n=0°$ and $\alpha_1 \ldots \alpha_n<180°$.

If E is represented as an additional time interval $t_d$ (FIG. 8A) the symmetry of the hyper-echo sequence for resonant spins is not disturbed. Spins having a certain off-resonance frequency $\omega>0$ experience in contrast thereto a phase change $\Delta\phi$ corresponding to $\Delta\phi=\omega t_d$. Same causes distortion of the symmetry of the hyper-echo sequence and the signals of said spins are suppressed. $E(\phi_E)$ may also be designed much more complex.

FIG. 8B shows as further example introduction of an additional spin echo interval with symmetrical strong magnetic field gradients. Moving spins are dephased by these gradients. When all spins move uniformly as in vascular flow, this leads to velocity-dependent phase changes of the observable magnetization which impairs the symmetry condition of hyper-echo formation and thus causes attenuation of the hyper-echo signal.

Spin ensembles which move incoherently due to molecular diffusion experience an amplitude change due to the incoherent dephasing, which depends on the diffusion constant and will also attenuate the amplitude of the subsequent hyper-echo. Formation of the hyper-echo per se will not be influenced by diffusion.

In a conventional spin echo sequence, spins moving at a constant velocity are represented without signal loss but with altered signal phase. In a hyper-echo sequence, in which the signal portion $M'_R(Mx,My,Mz)$ represented in equation [14] is dephased and therefore does not contribute to the total signal, phase effects do not occur.

Change of the signal phase depending on the motion and thus loss of the hyper-echo formation will occur merely through switching a bipolar magnetic field gradient by one (or several) of the refocusing pulses with otherwise constant time scheme (FIG. 8C).

The embodiments shown in FIGS. 8A through 8C of a modified hyper-echo sequence are again exemplarily. Literature (see e.g. (D9), (D10)) shows a large number of method steps which include concrete change of the signal phase and/or amplitude and can be applied also in a hyper-echo sequence.

It is to be noted that all modifications which, when applied to conventional spin echo or gradient echo sequences, lead to phase change, effect a signal intensity loss in the hyper-echo formation. Phase effects will depend on the fate of the magnetization component orthogonal to that leading to hyperecho-formation.

3.2 Hyper-echos for Suppressing of Signals of Coupled Spins

As initially mentioned, hyper-echo refocusing according to equation [11] is true for mechanisms, such as chemical shift, susceptibility etc., i.e. spin states which are characterized by a temporal development of the phase and which are inverted by a 180° pulse. Other mechanisms such as zero and multiple-quantum coherences and J-coupling show a different refocusing behavior and thus do not follow the same conditions for hyper-echo formation.

On the other hand, following the general symmetry relations described in Eq.[1]–[5] can also be applied to such mechanisms, such that a hyper-echo is then selectively formed for coupled systems, however, not for uncoupled spins. Corresponding selection of $\alpha_n$, $\phi_n$, $\phi_n$, permits discrimination of the corresponding spin states.

Some typical applications for coupled spins are exemplarily shown below. This representation, too, is only exemplarily and not complete. Further applications for other states such as zero and multiple quantum coherences can be easily derived from the basic equation [11].

Spin systems comprising J-coupling have a different refocusing behavior than coupled spin systems which is shown by an AX system below. Extension to other systems is easily possible. An AX system is characterized as weakly coupled system wherein the difference of the chemical shifts of the A and X nuclei is larger than the coupling constant J. Such a system is characterized by two doublets. If a refocusing pulse is applied to such a system, magnetizations are refocused on the one hand and on the other hand, the corresponding coupling partners are simultaneously exchanged which means that after this double inversion, the spin system behaves with respect to J-coupling as if no refocusing had taken place.

When refocusing pulses having a flip angle of exactly 180° are applied, this causes that the phase of the echos of coupled spins develops differently than that of uncoupled spins. This is the basis of methods such as COSY etc.

When several pulses are applied which have a flip angle other than 180°, this phase development causes increasingly destructive interference and thus signal loss. In particular, with CPMG sequences, there is a positive interference loss of the different signal contributions corresponding to ref. (D3) if the pulse separation with respect to J and $\Delta\sigma$ is sufficiently large (D8). It is therefore possible to suppress the signals of coupled spins through a corresponding multi-pulse sequence. Although the principle is known, such a method is not often used in practice since the required condition of using flip angles <180° leads to signal loss of the observed uncoupled spins and this method is disadvantageous compared to other discrimination methods.

In contrast thereto, a sequence which forms a hyper-echo with respect to the signals of uncoupled spins results in full signal intensity, whereas signals of coupled spins are suppressed since they effectively "see" another phase of the refocusing pulses. Towards this end, we observe such a doublet signal and assume that the reference frequency is in the center of the doublet. The doublet signal will then experience a phase development according to cos(J/2*tn) wherein tn is the time after excitation (FIG. 9).

A particularly advantageous feature of this application is given in that with corresponding selection of $\alpha_n$, $\phi_n$, $\phi_n$ signals of spins of systems having different coupling constants can be simultaneously suppressed.

Suppression of the signals of coupled spins is prevented by selecting the time of the central 180° pulse=1/J (FIG. 9 below). This is true, of course, only for spins having particular coupling constants J.

This principle of different phase development can be also used for the reversed purpose of specifically selecting coupled spins. This is achieved in that the phase development according to J-coupling in the phases on of the refocusing pulses is taken into consideration. Modification of a hyper-echo sequence according to equation [11] leads to incrementation of each pulse phase $\phi_n$ about arcsin(J/2*$t_n$) and shows that formation of a hyper-echo can be achieved only for the corresponding signal whereas for signals with different coupling constants and also for signals with uncoupled spins, the symmetry relation according to equation [11] is not met and same thus appear attenuated, wherein already a few refocusing pulses achieve attenuation leading to a practically complete suppression of said signals.

Corresponding to this simple example, a large number of pulse sequences can be devised which have the same feature, i.e. that the symmetrical relation for hyper-echo formation is met in each case only for the spins to be observed, however not for others. This is true in particular also for zero and multiple-quantum coherences for which a hyper-echo method with corresponding selection or suppression of the differently associated signals can be easily derived from the description with respect to J-coupling.

The observation that when the symmetry of the phase development according to the above chapter 3 is not fulfilled, only the cosine contribution of the magnetization contributes to the hyper-echo formation, there is the possibility of using the hyper-echo formation as polarization filter which allows passage only of signals with a symmetry following the hyper-echo sequence and deletes the signal contributions which are orthogonal thereto. Application of several such polarizations, optionally with selection under different polarization angles, permits specific selection of signals whose dephasing follows corresponding and precise handicaps.

4. Spin Inversion

Application of a sequence according to equation [11] to pure z magnetization leads to spin inversion as used for so-called inversion recovery sequences for T1 measurements or also in the field of imaging for achieving T1 weighted images. Application of a hyper-echo sequence in contrast to conventional inversion with one single 180° pulse thereby permits use of methods for selective spin inversion described under chapter 3. On the one hand, one can obtain complex inversion profiles, on the other hand, selective inversion corresponding to chemical shift, J-coupling, different zero and multiple-quantum coherences etc. is possible.

Considerations for Implementation

In implementing hyper-echoes, one has to differentiate that formation of hyper-echos can be integrated either in the course of the measurement with a certain pulse sequence which is advantageous mainly for the sequences mentioned above in chapters 1 and 2. Implementation is also possible or even advantageous, wherein formation of a hyper-echo initially serves for special preparation of the spin system, and data acquisition is carried out subsequently using any appropriate sequence (according to FIG. 2D).

The acquisition module can thereby be formed from any appropriate signal generation sequence. Mainly in applications in $M_R$tomography, the acquisition module may consist of a corresponding imaging module (gradient echo, echo planar imaging, RARE(TSE, . . . ) spiral scan etc.) such that images are produced which have a contrast which corresponds to the characteristic of the hyper-echo.

There are further applications wherein hyper-echos are used in a different context than up to now. Literature discloses (D3) that in multi-pulse sequences, a number of possible refocusing paths for transverse magnetization, which increases with the $3^{rd}$ power of the number of pulses, is generated of which often only part is used to contribute to signal read-out. When such a sequence is repeated with a repetition time which is smaller than the longitudinal relaxation time T1, undesired signals may be formed which can be prevented through hyper-echo formation since thereby all refocusing paths are combined again. Such a "clean-up" function may be reasonable in particular also when using NMR in quantum computing since hyper-echo formation can serve here as deleting function of the information stored in the spin system as transverse magnetization.

Further advantages of the invention can be extracted from the description and the drawing. The features mentioned above and below may be used in accordance with the invention either individually or collectively in any arbitrary combination. The embodiments shown and described are not to be understood as exhaustive enumeration but rather have exemplary character for describing the invention.

The invention is shown in the drawing and is further explained by means of embodiments.

BRIEF DESCRIPTION OF THE DRAWING

FIGS. 4A and 4B show the principle of application of the hyper-echo mechanism, the Mtr and Mz schemes applying to both figures;

FIGS. 5A through 5G show the hyper-echo sequences on the basis of gradient echo sequences;

DESCRIPTION OF THE PREFERRED EMBODIMENT

Figures 1A, 1B, 1C:
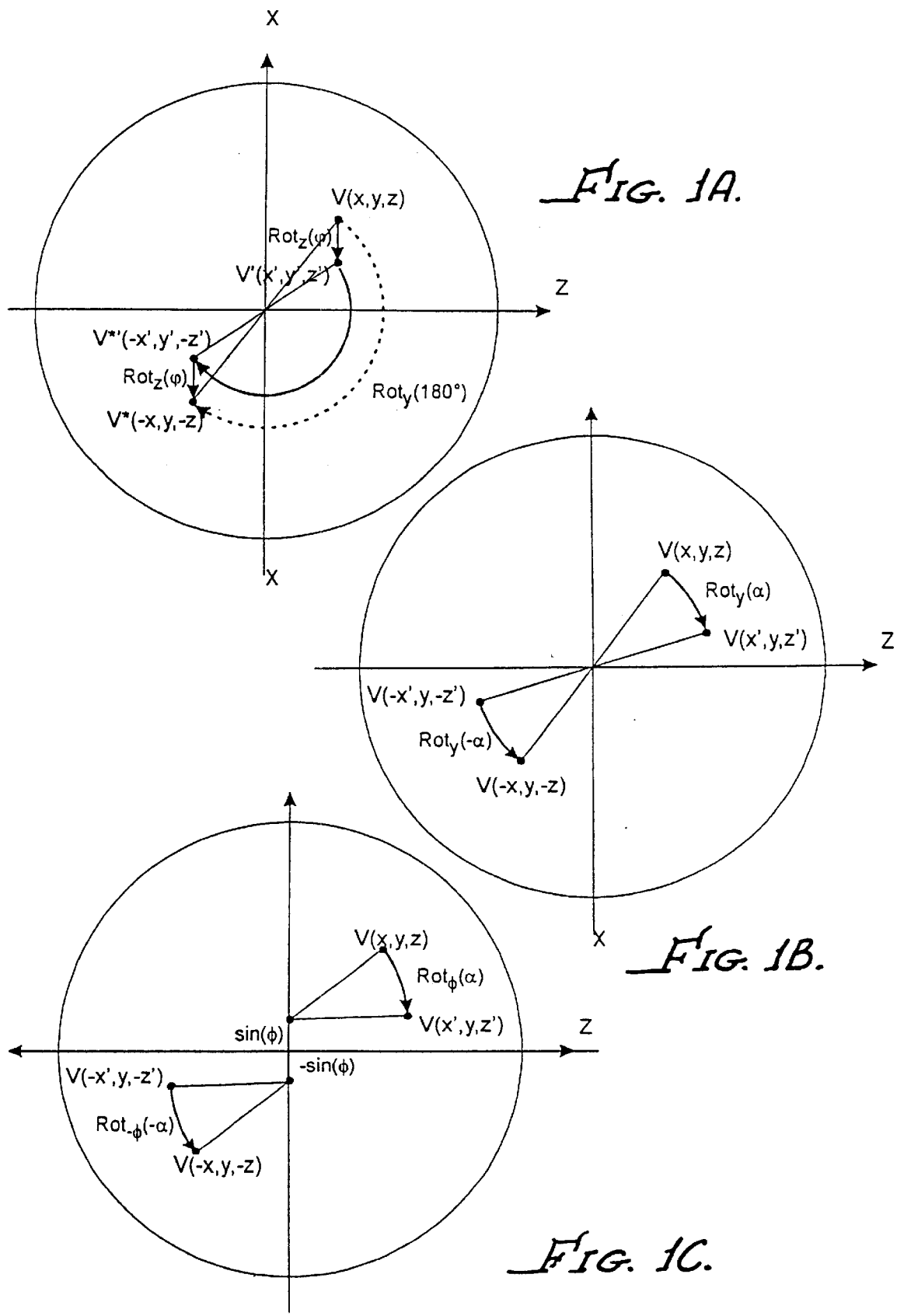
FIGS. 1A through 1C show a demonstration of the symmetry relations with respect to rotation.

FIG. 1A shows the symmetry with respect to rotation about the z axis corresponding to equations [4] and [8] i.e. perpendicular to the image plane, from which follows that the vector V* obtained from V through rotation about z with $\phi$, subsequent rotation about y by 180° and subsequent renewed rotation about z with $\phi$ (arrows) is identical to a rotation of V about y by 180° (arrow shown in broken lines). The y axis which is perpendicular to the image plane marks the zero point of the x-z plane.

FIG. 1B shows the symmetry with respect to rotation about the y axis corresponding to equation [5] wherein trivially a sequence of rotations about y with $\alpha$ 180° and $-\alpha$ is identical to rotation about 180°.

FIG. 1C shows the symmetry with respect to rotation about a rotational axis tilted with respect to the y axis by $\phi$ corresponding to equation [6]. Corresponding to the representation in top view, the pole of the rotational axis is shifted with respect to the zero point defined by the y axis about $\sin(\phi)$.

Figure 2A:
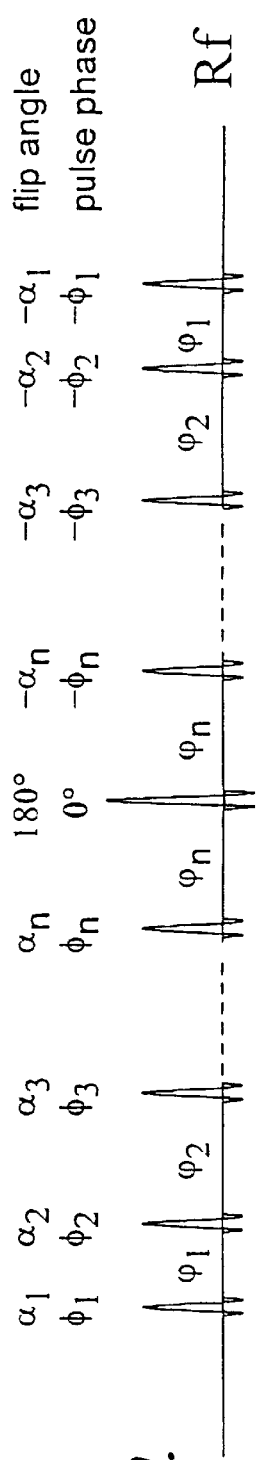
FIG. 2A shows a hyper-echo sequence.

The radio frequency pulses with a flip angle $\alpha_1 \ldots \alpha_n$ and the respective phase $\phi_1 \ldots \phi_n$ are separated from the dephasing intervals $\phi_1 \ldots \phi_n$ in FIG. 2A. After a central refocusing pulse, the sequence is applied in reversed order with pulses of opposite phase and amplitude. The order of the dephasing intervals is also reversed, however, the dephasings $\phi_1 \ldots \phi_n$ remain identical. Independent of the type of magnetization at the start of the sequence, same is refocused through the pulse sequence about the rotational axis of the refocusing pulse.

Figure 2B:
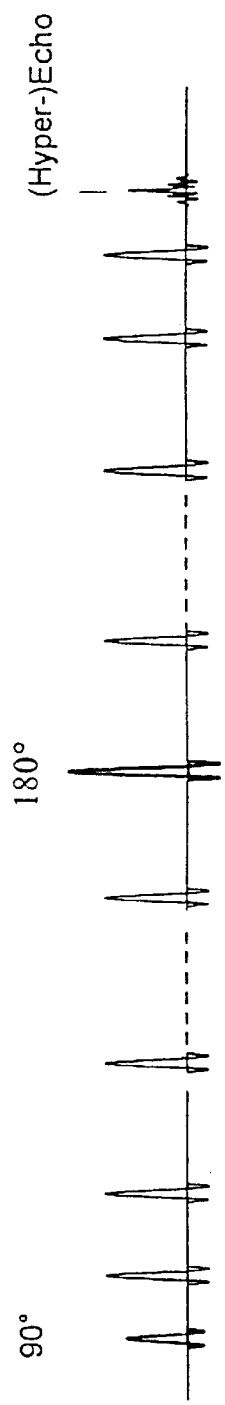
FIG. 2B shows the principle of application of a hyper-echo sequence through integration into a known sequence.

In FIG. 2B, additional pulses corresponding to the basic principle of FIG. 2A are introduced into an existing sequence (in this case: a simple spin echo experiment with a 90° and a 180° pulse (broad lines)) such that a hyper-echo is formed instead of a normal spin echo.

Figure 2C:
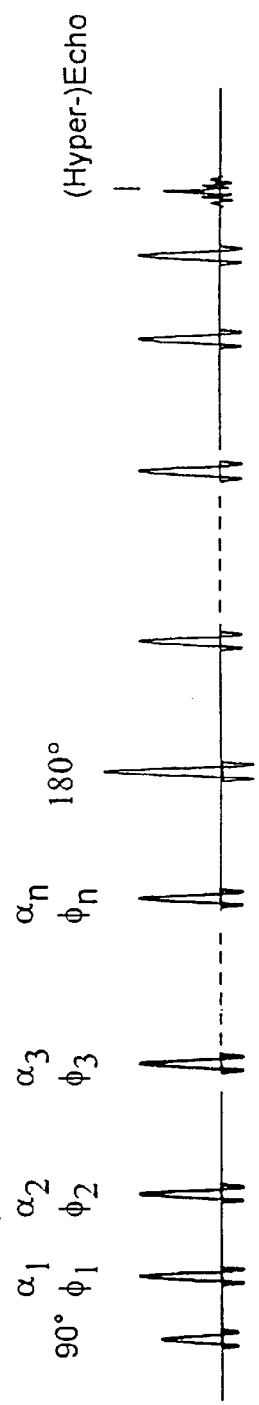
FIG. 2C shows the principle of application of a hyper-echo sequence through supplementation.

In FIG. 2C, an existing sequence (in this case a multi-echo experiment with n refocusing pulses ) is supplemented by a 180° pulse and the reversed pulse sequence to form a hyper-echo. The initial excitation pulse (most often a 90° pulse) is usually not included in the supplementation such that the hyper-echo is generated as signal of transverse magnetization corresponding to magnetization generated by the 90° pulse.

Figure 2D:
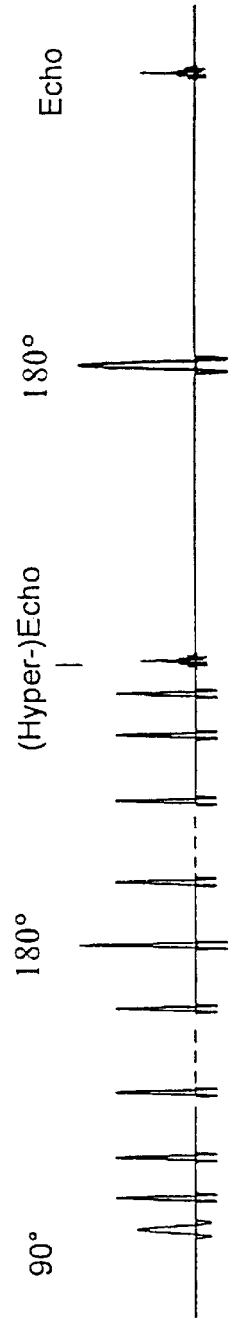
FIG. 2D shows the principle of application of a hyper-echo sequence as preparation sequence.

In FIG. 2D, a hyper-echo sequence precedes a conventional sequence (in this case again a spin echo) to modify the contrast behavior corresponding to the hyper-echo sequence, which may also be modified for spin selection according to the principles described above.

Figure 3:
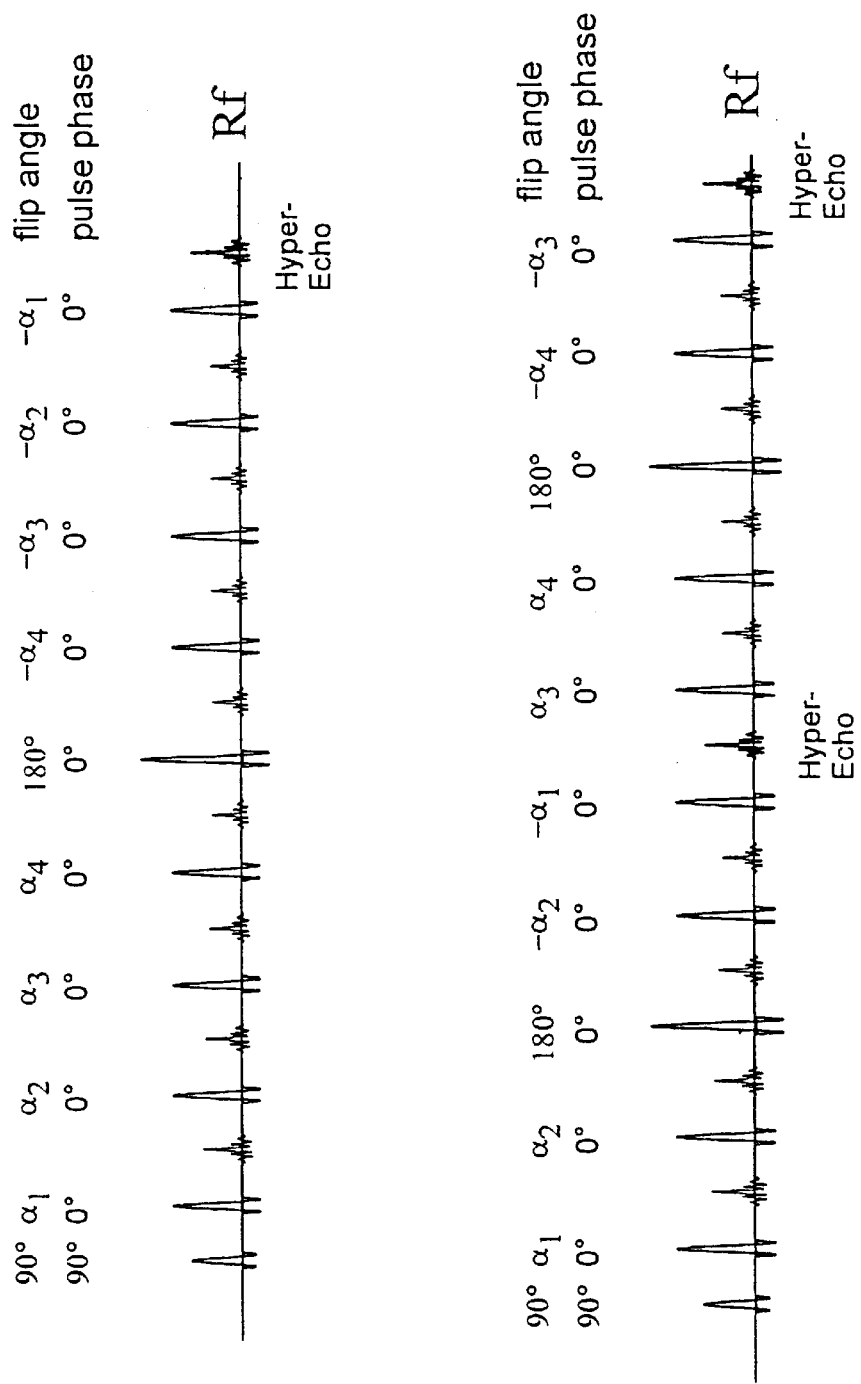
FIG. 3 shows a pulse sequence of a modified CPMG sequence corresponding to the inventive method.

The refocusing pulse flip angles $\alpha_n$ according to FIG. 3 are generally <180° and may be different from each other. Refocusing to a complete echo amplitude may occur once (above) or several times (below). Application in imaging involves additional magnetic field gradients which are correspondingly switched (e.g. according to (D3)) in order to encode spatial information into the signal.

At the time of formation of the hyper-echo, a $-90°$ pulse is applied according to FIGS. 4A and 4B. During the multi-echo train, the transverse magnetization Mtr decays according to spin relaxation, z magnetization Mz recovers with T1. The relaxation curves are shown only schematically. The fully refocused transverse magnetization at the time of the hyper echo formation is transferred into z magnetization MDE. It is much closer to the equilibrium value $M_0$ than z magnetization $M_{SAT}$ without flipback (broken lines).

In FIGS. 5A through 5D, Rf, GS, GR and GP designate the radio frequency pulses, and the slice selection, read and phase encoding gradients respectively. First, in FIG. 5A a number of m gradient echoes are generated through m-fold repetition, wherein the flip angle $\alpha$ and phase $\phi$ of the used pulses can be freely selected and are constant in the most simple case (however, not necessarily preferred case). Subsequently, the refocusing pulse (in the simplest case a 180° pulse) is applied and finally the gradient echo sequence is repeated m times, wherein flip angle and phase of the used pulses are determined by equation [11]. The number of repetitions m can thereby be selected freely such that a complete data set required for image reconstruction is produced through single application or repeated application of this sequence.

When applied to z magnetization, the hyper-echo mechanism leads to inversion. To realize a hyper-echo as transverse magnetization, the sequence can be preceded by an excitation pulse with a 90° flip angle in the simplest case, as shown in FIG. 5B.

Figure 5A:
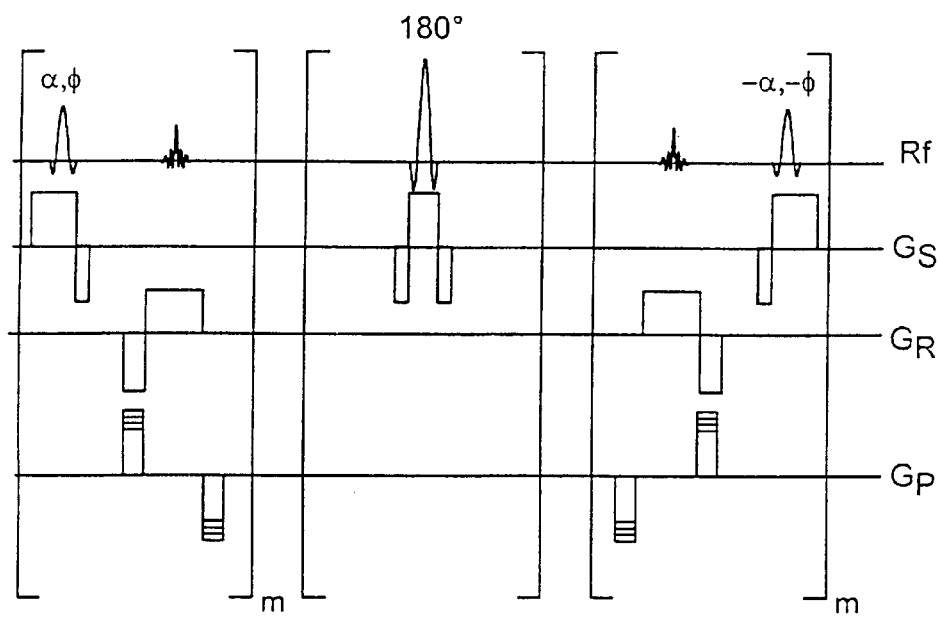
Figure 5B:
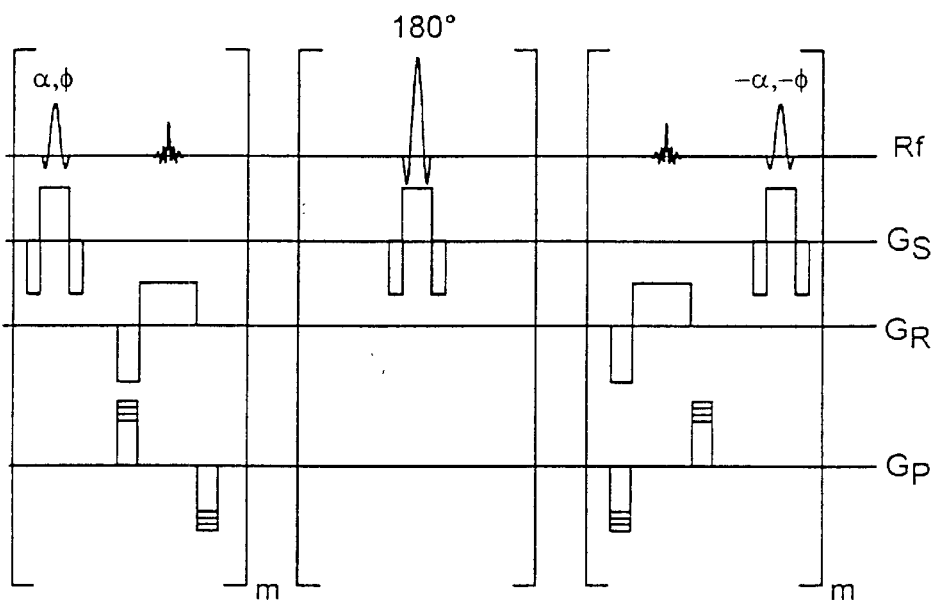
Figure 5C:
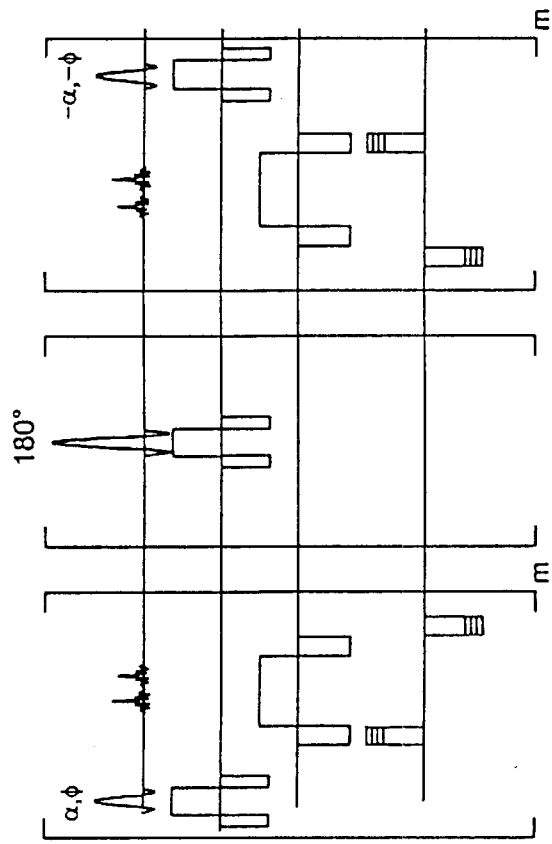

FIG. 5C shows a section from a gradient echo sequence comprising several hyper echos, wherein also in this case, signal preparation can be preceded by a 90° pulse like in FIG. 5B.

Figure 5D:
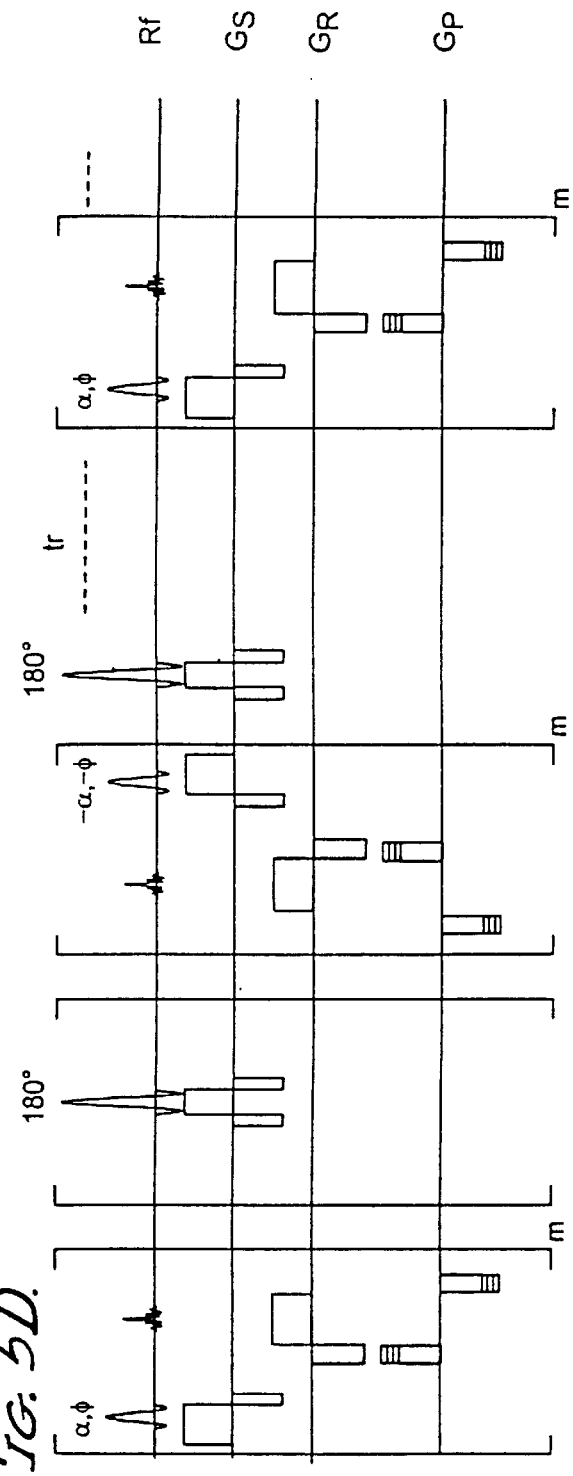
Figure 5E:
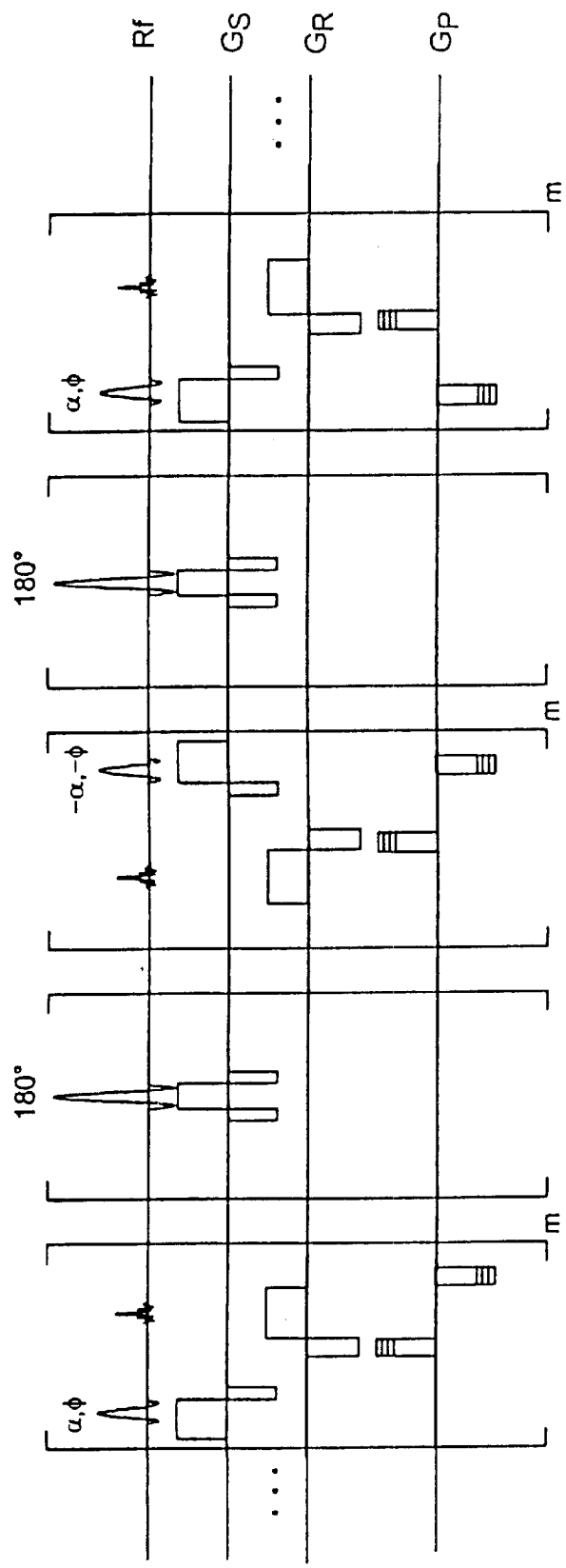

FIG. 5D shows a driven equilibrium sequence, wherein the formed hyper-echo is transferred by a corresponding flip back pulse in the z magnetization.

Figure 6:
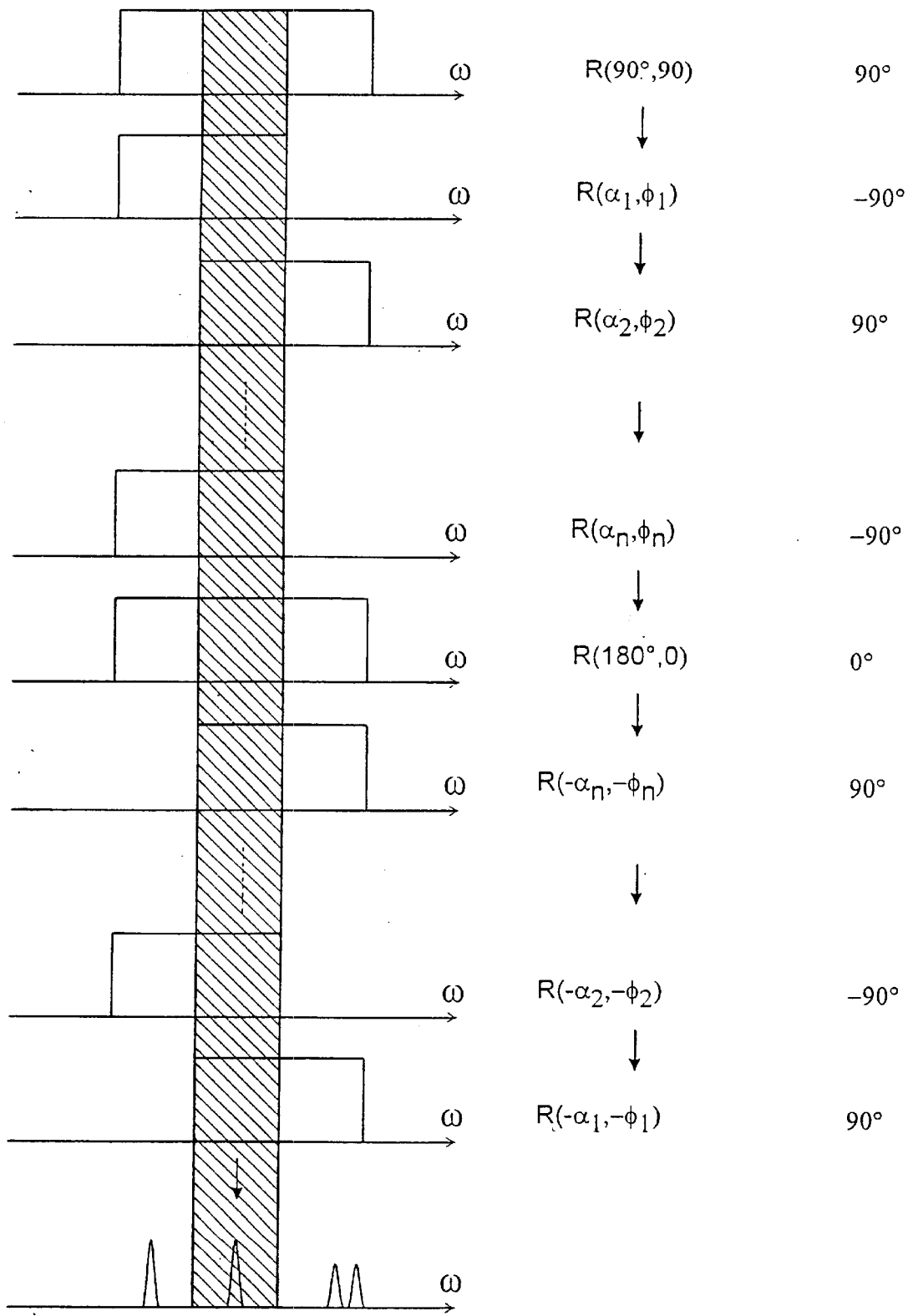
FIG. 6 shows a schematic representation of the principle of spin selection.

The pulses used for hyper-echo formation in accordance with FIG. 6 have excitation profiles which are shifted with respect to one another, such that the condition for forming a hyper-echo is met only for spins whose resonance frequency is within the overlapping region (grey). Signals of spins which are detected only by part of the pulses and for which the condition for hyper-echo formation is not met, are suppressed. The dephasing intervals φ between the pulses are not shown.

Figure 7:
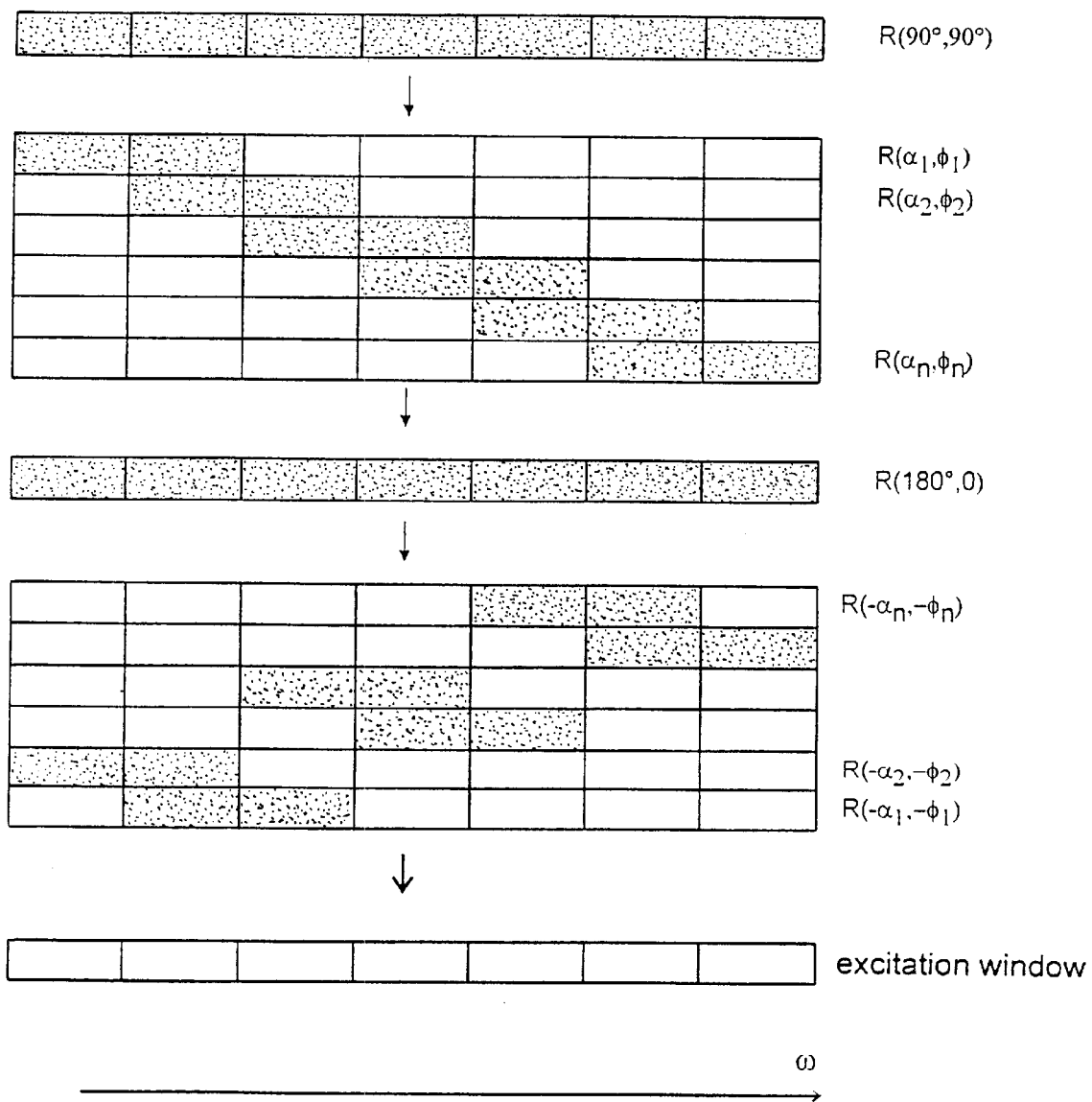
FIG. 7 shows a generalized scheme of the principle of FIG. 6 for demonstration how a complex excitation window can be realized from a hyper-echo sequence with pulses with shifted excitation profile.

The pulses in FIG. 7 show different excitation profiles (dark grey). The hyper-echo conditions are met merely for individual spectral windows (light grey).

Figure 8A:
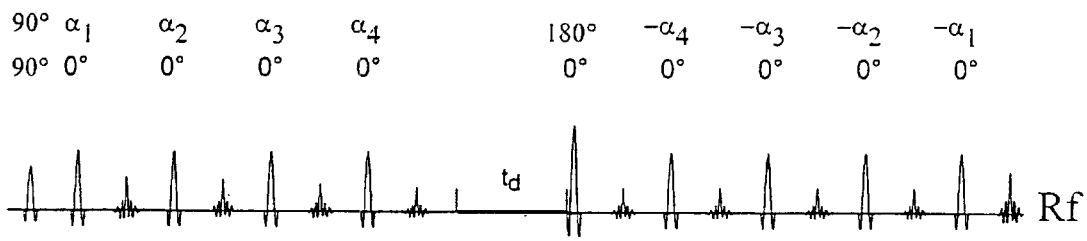
FIGS. 8A through 8C show modified hyper-echo sequences.

FIG. 8A shows a sequence derived from the CPMG hyper-echo sequence shown in FIG. 3 wherein an additional interval td was introduced before the central 180° pulse. For spins whose signal phase changes during td, the hyper-echo refocusing mechanism is no longer met.

Figure 8B:
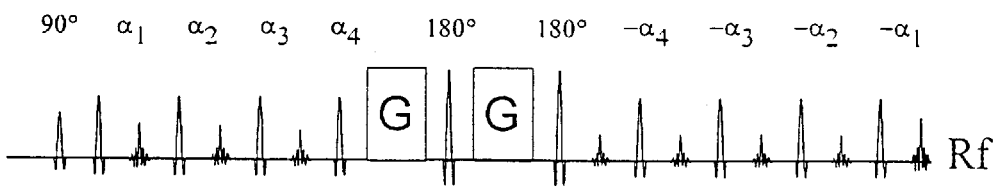

FIG. 8B shows a sequence, wherein a motion-dependent change of the signal phase is effected through an additional spin echo interval with symmetrical magnetic field gradient G which also produces hyper-echo formation loss.

Figure 8C:
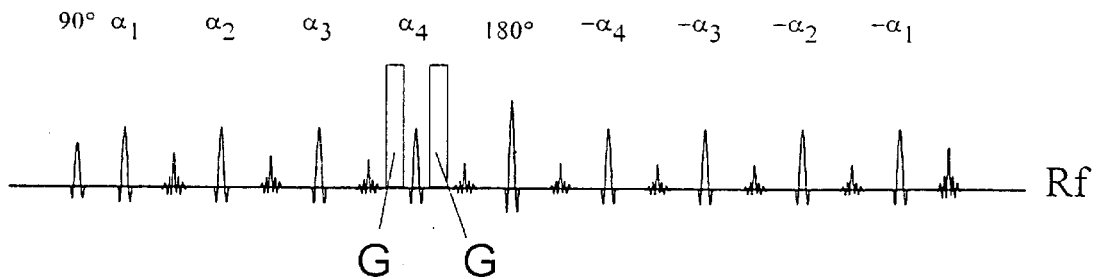

FIG. 8C shows that a motion-dependent change of the signal phase and thus change of the amplitude of the hyper-echo can be effected already merely through corresponding magnetic field gradients alone in an otherwise unchanged hyper-echo sequence.

Figure 9:
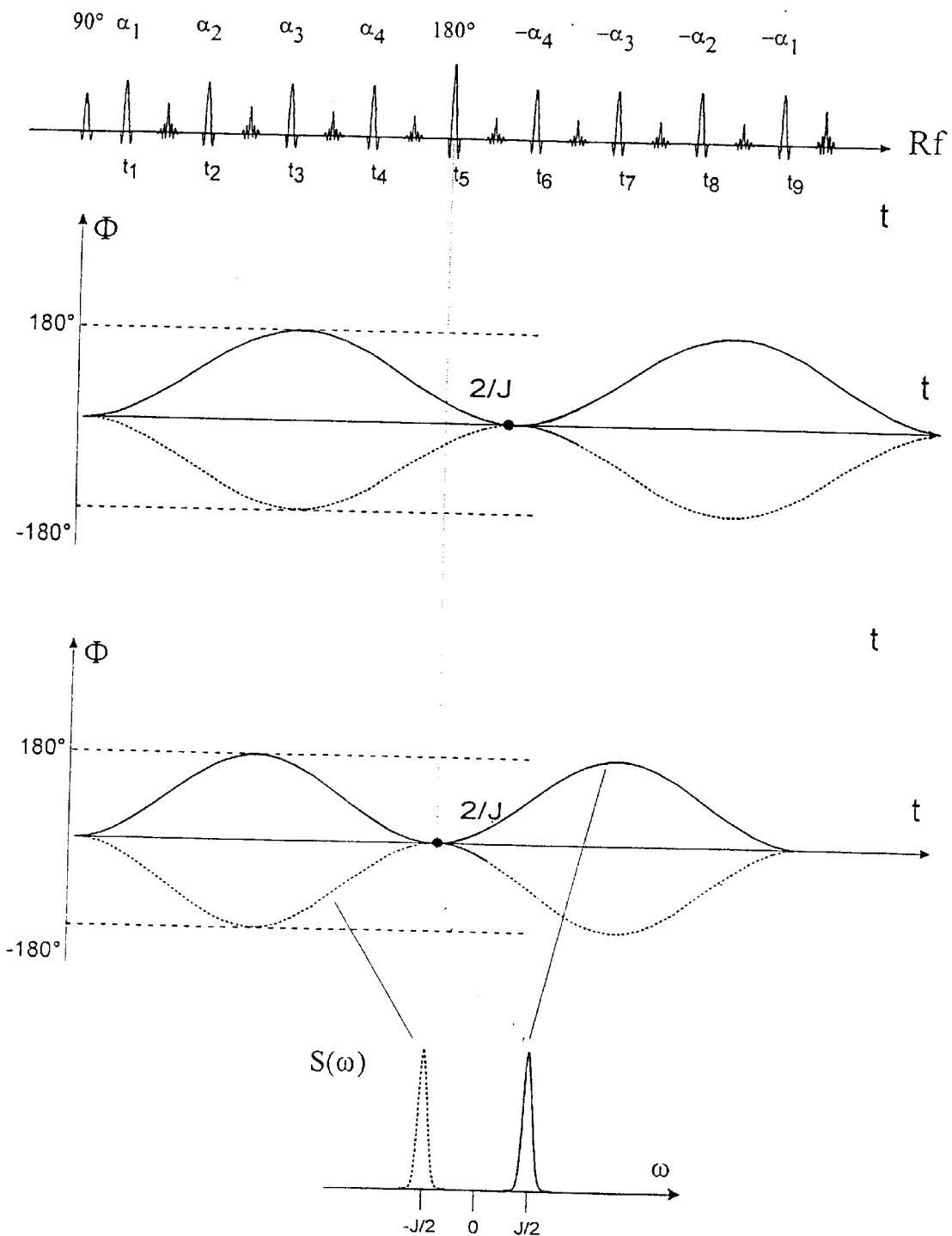
FIG. 9 shows the effect of J-coupling on the hyper-echo formation.

For coupled spins, a periodic phase change D of the two signals of the doublet occurs due to J-coupling, whose spectrum S(ω) is characterized by a doublet as shown in FIG. 9. If a hyper-echo sequence is applied to such a doublet, the phase $\phi_n$ of each pulse is formally changed by +−arcsin $(t_n*J/2)$, wherein tn is the time of the pulse. In general, the symmetry of the hyper-echo formation is disturbed and the signals of coupled spins are not refocused. If the time of the central 180° pulse is 1/J, the symmetry remains unchanged. These doublets are illustrated.

Figure 10:
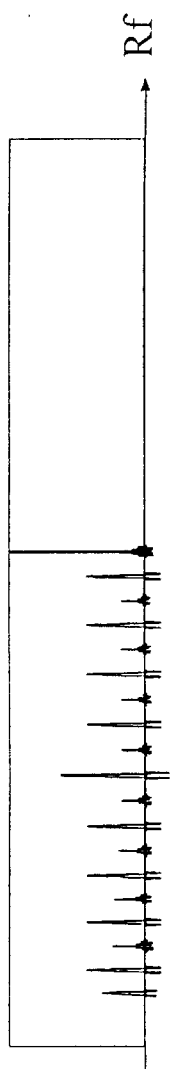
FIG. 10 shows a generalized scheme of a measuring sequence with hyper-echo preparation module and subsequent acquisition module.

FIG. 10 finally shows a measuring sequence wherein at first magnetization is generated via hyper-echo formation (optionally with one of the modifications described) and is subsequently read with any read-out sequence.

LITERATURE (D1) Hahn E L, Spin Echoes, Phys.Rev. 80:580–594 (1950)
(D2) Meiboom S, Gill D, Modified Spin-Echo Method for Measuring Nuclear Relaxation Times, Review of Scientific Instruments, 29:688–691 (1958)
(D3) Hennig J, Multiecho Imaging Sequences with Low Refocusing Flip Angles, J.Magn.Reson., 78:397–407 (1988)
(D4) Le Roux P, Hinks R S, Stabilization of echo amplitudes in FSE sequences, Magn Reson Med. 30:183–90 (1993)
(D5) Alsop D C, The sensitivity of low flip angle RARE imaging, Magn Reson Med. 37:176–84 (1997)
(D6) Gullion T, Baker D E, Conradi M S., J.Magn.Reson. 89, 479 (1990)
(D7) van Uijen C M, den Boef J H, Driven-equilibrium radiofrequency pulses in NMR imaging, Magn Reson Med. 1984 Dec;1(4):502–7.
(D8) Hennig J, Thiel T, Speck O, Improved Sensitivity to Overlapping Multiplet Signals in in vivo Proton Spectroscopy Using a Multiecho Volume Selective (CPRESS-) Experiment, Magn Reson Med. 37: 816–20 (1997)
(D9) Haase A, Snapshot FLASH MRI. Applications to T1, T2, and chemical-shift imaging, Magn Reson Med. 13:77–89 (1990)
(D10) Norris D G, Ultrafast low-angle RARE: U-FLARE, Magn Reson Med. 17: 539–542 (1991)

I claim:

1. A method of nuclear magnetic resonance spectroscopy or nuclear magnetic tomography comprising the steps of:

applying a hyper-echo sequence of radio frequency pulses to a spin ensemble in a manner that for at least 2n+1 consecutive pulses within the sequence, n being greater than one and the pulses having flip angles $\alpha_1 \ldots \alpha_{2n+1}$ and phases $\Phi_1 \ldots \Phi_{2n+1}$, and wherein spins are respectively dephased by $\phi_1 \ldots \phi_{2n}$ between successive pulses;

using a central (=(n+1)st) pulse as a refocusing pulse with a preferred flip angle of 180° and phase $\Phi_0$.

placing corresponding pulses symmetrically around the central (=(n+1)st) refocusing pulse, such that for the i-th pulse with i between 1 and n the following relations hold: the flip angle $\alpha_{(n+1)-i}$ of the (n+1−i)th pulse is equal to the negative flip angle of the corresponding (n+1+i)th pulse:

$$\alpha_{(n-1)-i} = \alpha_{(n+1)+i}$$

and the phase of the (n+1−i)th pulse is equal to the negative phase of the corresponding (n+1+i)th pulse with respect to the phase of the central refocusing pulse:

$$\Phi_{(n+1)-i} = \Phi_0 - \Phi_{(n+1)-i}$$

using dephasing intervals following the i-th pulse, which are symmetrical around the central and (n+1)st refocusing pulse according to the relation:

$$\phi_{(n+1)-i} = \phi_{n+1},$$

such that at the end of a pulse sequence, where the phase of the central refocusing pulse is chosen to be aligned along My, the vector describing the initial magnetization $M_A$(Mx,My,Mz) of the spin ensemble will appear to be rotated to $M_R$(−Mx,My, −Mz) by 180° around the axis of the radio frequency field of the central refocusing pulse (=hyper-echo formation),:

$$M_R(-Mx, My, -Mz) = \text{Rot}_y(180°) * M_A(Mx, My, Mz).$$

2. Method according to claim 1, wherein the hyper-echo sequence is preceded by a further rf-pulse used for excitation with a flip angle of optimally 90°, which leads to the formation of coherent magnetization $M_A$ and which will accordingly then form $M_R$ as fully coherent magnetization.

3. Method according to claim 2, wherein after the sequence leading to hyper-echo formation a further radio frequency pulse is applied the phase of which is orthogonal to the phase of $M_R$ and the flip angle such that $M_R$ is transformed into z magnetization, wherein the time until adjustment of the thermal equilibrium of the excited spin system is shortened or when repeating the sequence with constant recovering time, the intensity of the signals which contribute to the hyper echo, is increased.

4. Method according to claim 2, wherein after the sequence leading to hyper-echo formation a further radio frequency pulse is applied the phase of which is orthogonal to the phase of $M_R$ and the flip angle such that $M_R$ is transformed into −z magnetization wherein the time until adjustment of the thermal equilibrium of the excited spin system is prolonged or when repeating the sequence with constant recovering time, the intensity of the signals which contribute to the hyper echo, is shortened.

5. Method according to claim 4, wherein a hyper-echo sequence is applied to the spin system with pure z magnetization, wherein magnetization is transferred into −z magnetization, followed by an inversion pulse, which again transfers the spin system to +z magnetization, thereby reducing the time until adjustment of the thermal equilibrium of the excited spin system or increasing the intensity of the signals which contribute to the hyper-echo when the sequence is repeated with constant recovering time.

6. Method according to claim 1, wherein a pulse sequence is applied, corresponding to the hyper-echo formation, onto z magnetization such that at the end of the sequence, z magnetization is inverted.

7. Method according to claim 1, the pulse sequence is applied to transverse magnetization corresponding to hyper-echo formation such that transverse magnetization is refocused at the end of the sequence.

8. Method according to claim 1, wherein a measuring sequence consists of an excitation pulse with subsequent multiple refocusing in the sense of a multi-echo sequence, such that hyper-echo formation is carried out once or several times during the multi-echo sequence thereby forming one or more hyper-echoes during each multi-echo train.

9. Method according to claim 1, wherein symmetry required for hyper-echo formation is disturbed through a modulation step E such that merely spins whose phase is not disturbed by the modulation step contribute to hyper-echo formation whereas spins for which the modulation step effects a phase change, form a correspondingly attenuated hyper-echo.

10. Method according to claim 1, wherein spin selection is carried out such that the phase of signals of spins with J-coupling, zero and multiple-quantum coherences differs from the phase of spins in uncoupled signals such that a hyper-echo is formed only for uncoupled spins.

11. Method according to claim 1, wherein a spin selection is carried out such that the phase of the radio frequency pulses follows the phase development of spins with J-coupling, zero or multiple quantum coherences etc. such that a hyper-echo is formed only for those spins for which the conditions for hyper-echo formation are met.

12. Method according to claim 1, wherein hyper-echo formation is carried out on the basis of an imaging sequence, preferably, RARE, GRASE, Echo Planar Imaging, FLASH, or Spiral Imaging.

13. Method according to claim 1, wherein a hyper-echo is formed after excitation of the spin system and subsequently the signal of the hyper echo is read.

14. Method according to claim 13, wherein an imaging sequence, preferably RARE, Echo Planar-Imaging, Snapshot-FLASH or Spiral Imaging is used for reading out a signal.

15. Method according to claim 1, wherein a measuring sequence is applied co several nuclei with different gyromagnetic relationship, wherein the partial sequence acting on the least one nucleus, effects hyper-echo formation.

* * * * *